(12) United States Patent
Chang

(10) Patent No.: US 10,978,555 B1
(45) Date of Patent: Apr. 13, 2021

(54) SEMICONDUCTOR STRUCTURE AND METHOD OF FORMING THE SAME

(71) Applicant: NANYA TECHNOLOGY CORPORATION, New Taipei (TW)

(72) Inventor: Chin-Piao Chang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 17 days.

(21) Appl. No.: 16/681,782

(22) Filed: Nov. 12, 2019

(51) Int. Cl.
*H01L 29/06* (2006.01)
*H01L 49/02* (2006.01)

(52) U.S. Cl.
CPC .................................. *H01L 28/92* (2013.01)

(58) Field of Classification Search
CPC ......... H01L 28/92; H01L 28/75; H01L 28/87; H01L 28/88; H01L 28/90; H01L 28/91
See application file for complete search history.

(56) References Cited

U.S. PATENT DOCUMENTS 9,431,297 B2 * 8/2016 Wu ...................... H01L 23/5283
9,679,804 B1 * 6/2017 Chen .................. H01L 21/31144

* cited by examiner

*Primary Examiner* — Timor Karimy
(74) *Attorney, Agent, or Firm* — CKC & Partners Co., LLC

(57) ABSTRACT

A method of forming a semiconductor structure includes the following steps. A dielectric stack is formed on a bottom metal. A first mask layer is formed on the dielectric stack. The first mask layer has a plurality of first through holes, and a portion of the first through holes is in a central portion of the first mask layer. A second mask layer is formed on the first mask layer and in the first through holes. The second mask layer is patterned to form an opening between a central portion of the second mask layer covers the portion of the first through holes and is surrounded by the peripheral portion. The dielectric stack is etched below the first through holes the second through hole. A conductive layer is formed in the second through hole and on a top surface of the dielectric stack.

14 Claims, 10 Drawing Sheets

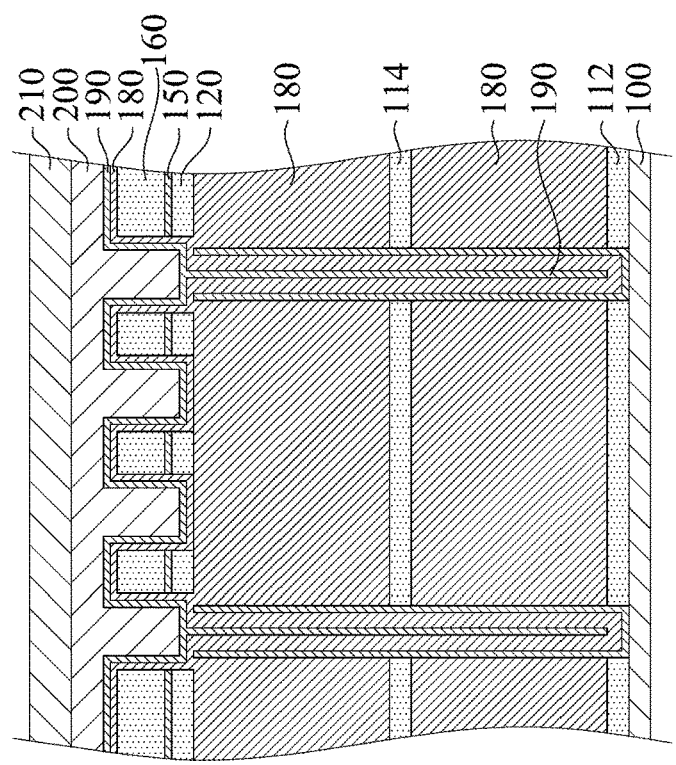
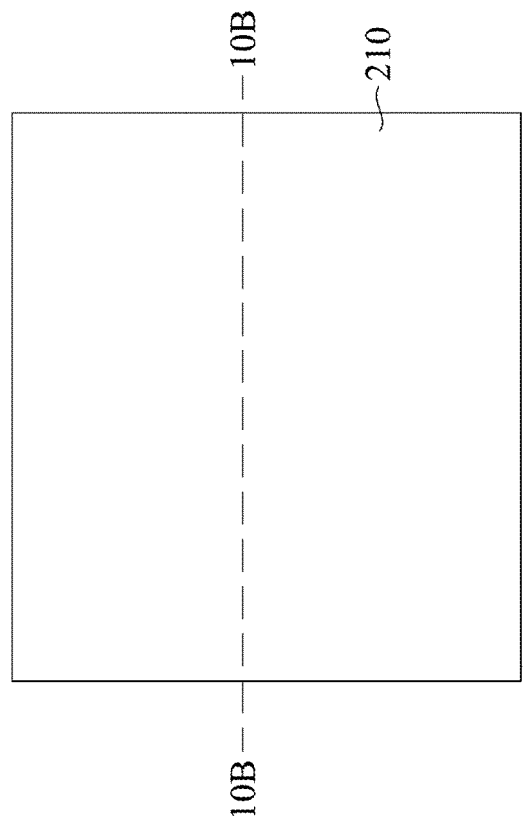
Fig. 10B
Fig. 10A

SEMICONDUCTOR STRUCTURE AND METHOD OF FORMING THE SAME

BACKGROUND

Technical Field

The present disclosure relates to a semiconductor structure and a method of forming the semiconductor structure.

Description of Related Art

With the rapid growth of electronic industry, the development of semiconductor devices has achieved high performance and miniaturization. Decoupling capacitors with small capacitance are needed for DRAM circuit design. In greater details, the decoupling capacitors can be built into chips to prevent voltage spikes in a power supply such as, for example, when the chip is initially powered or when various components of the chip are activated.

However, there is a risk to induce collapsed structure with a smaller array of the capacitors. It's because that smaller array of the capacitors are stood-alone during current fabrication method.

SUMMARY

According to one embodiment of the present disclosure, a method for forming a semiconductor structure includes the following steps. A method of forming a semiconductor structure includes the following steps. A dielectric stack is formed on a bottom metal. A first mask layer is formed on the dielectric stack. The first mask layer has a plurality of first through holes, and a portion of the first through holes is in a central portion of the first mask layer. A second mask layer is formed on the first mask layer and in the first through holes. The second mask layer is patterned to form an opening between a central portion of the second mask layer covers the portion of the first through holes and is surrounded by the peripheral portion. The dielectric stack is etched below the first through holes the second through hole. A conductive layer is formed in the second through hole and on a top surface of the dielectric stack.

In some embodiments of the present disclosure, the method of forming the semiconductor structure further includes forming a metal layer on a sidewall of the second through hole and the top surface of the dielectric stack before forming the conductive layer.

In some embodiments of the present disclosure, the method of forming the semiconductor structure further includes forming the metal layer on a bottom surface of the second through hole, such that the metal layer is in contact with the bottom metal.

In some embodiments of the present disclosure, the method of forming the semiconductor structure further includes etching the metal layer on the top surface of the dielectric stack to form a third through hole.

In some embodiments of the present disclosure, etching a portion of the metal layer is such that the third through hole directly connects to the second through hole.

In some embodiments of the present disclosure, the method of forming the semiconductor structure further includes forming a top electrode in the third through hole.

In some embodiments of the present disclosure, forming the top electrode in the third through hole is such that the top electrode electrically connects the conductive layer.

In some embodiments of the present disclosure, the method of forming the semiconductor structure further includes forming a first isolation on the dielectric stack before forming the first mask layer.

In some embodiments of the present disclosure, the method of forming the semiconductor structure further includes forming a second isolation layer on the first isolation layer, such that the metal layer is between the first isolation layer and the second isolation layer.

In some embodiments of the present disclosure, the method of forming the semiconductor structure further includes removing an oxide layer of the dielectric layer of the dielectric stack before forming the conductive layer.

In some embodiments of the present disclosure, the method of forming the semiconductor structure further includes forming a dielectric structure in the second through hole before forming the conductive layer, such that the conductive layer in the second through hole is surrounded by the dielectric structure.

In some embodiments of the present disclosure, the peripheral portion and the central portion of the second mask layer are made of photoresist materials.

In some embodiments of the present disclosure, patterning the second mask layer is such that the opening of the second mask layer directly connects the first through hole of the first mask layer.

In some embodiments of the present disclosure, patterning the second mask layer is such that a width of the opening of the second mask layer is larger than a width of the first through hole of the first mask layer.

In the aforementioned embodiments, since the second mask layer is patterned to form the opening between the central portion and the peripheral portion of the second mask layer, smaller array of capacitor (small-size capacitor) can be achieved. As a result, collapsed risk of the semiconductor structure can be avoided and the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 10A and FIG. 10B are respectively a top view and a cross-sectional view of a semiconductor structure at one stage in accordance with one embodiment of the present disclosure.

DETAILED DESCRIPTION

Figure 1B:
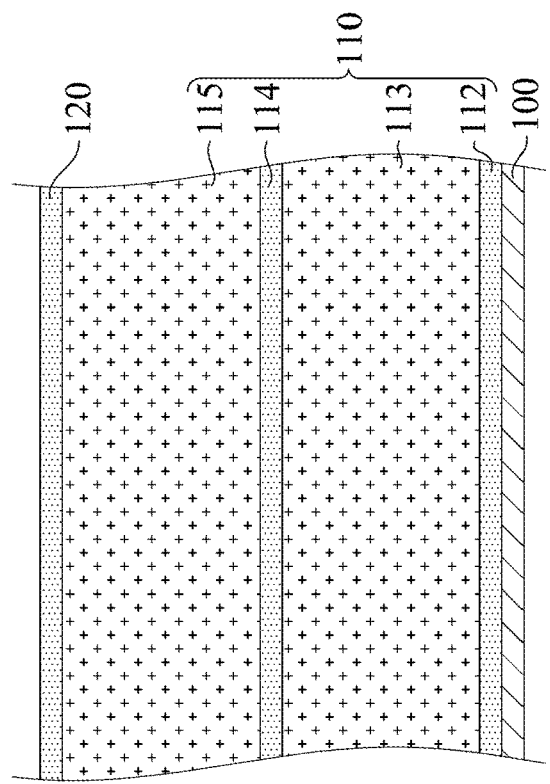
FIG. 1A and FIG. 1B are respectively a top view and a cross-sectional view of a semiconductor structure at one stage in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 1A:
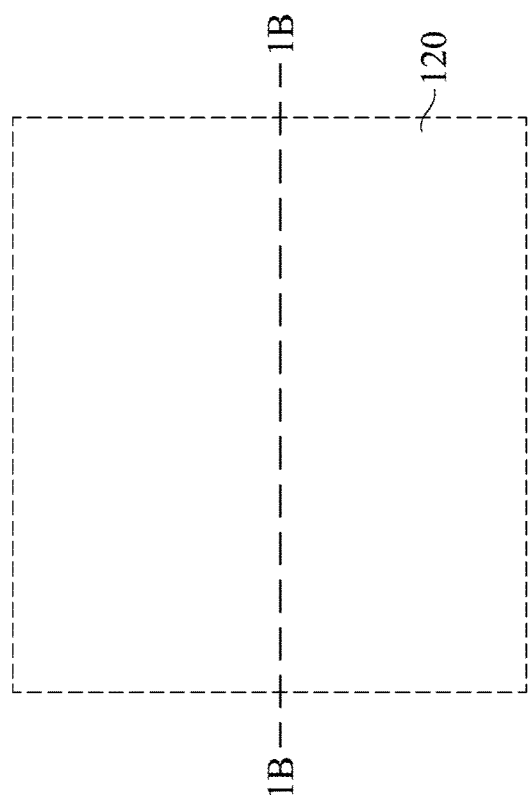

FIG. 1A and FIG. 1B are respectively a top view and a cross-sectional view of a semiconductor structure at one stage in accordance with one embodiment of the present disclosure. FIG. 1B is taken along line 1B-1B of FIG. 1A. Referring to FIG. 1A and FIG. 1B, a dielectric stack 110 is formed on a bottom metal 100. The dielectric stack 110 may include a plurality of nitride layers and a plurality of oxide layers alternately formed on the bottom metal 100. In greater details, a first nitride layer 112, a first oxide layer 113, a second nitride layer 114, and a second oxide layer 115 are formed in sequence on the bottom metal 100. In some embodiments, the first nitride layer 112 is in contact with the bottom metal 100. In some embodiments, the bottom metal 100 may serve as a bottom electrode of the semiconductor structure.

After the dielectric stack 110 is formed on the bottom metal 100, a first isolation layer 120 is formed on the dielectric stack 110. The first isolation layer 120 may be made of a nitride material. For example, the first isolation layer 120 is made of silicon nitride or other suitable dielectric materials. In some embodiments, the first isolation layer 120 is formed by chemical vapor deposition CVD, ALD, or other suitable process. In some embodiments, the first isolation layer 120 is made of same materials as the first nitride layer 112 and the second nitride layer 114.

In some embodiments, a substrate is formed before forming the bottom metal 100. The substrate may be a silicon substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 2B:
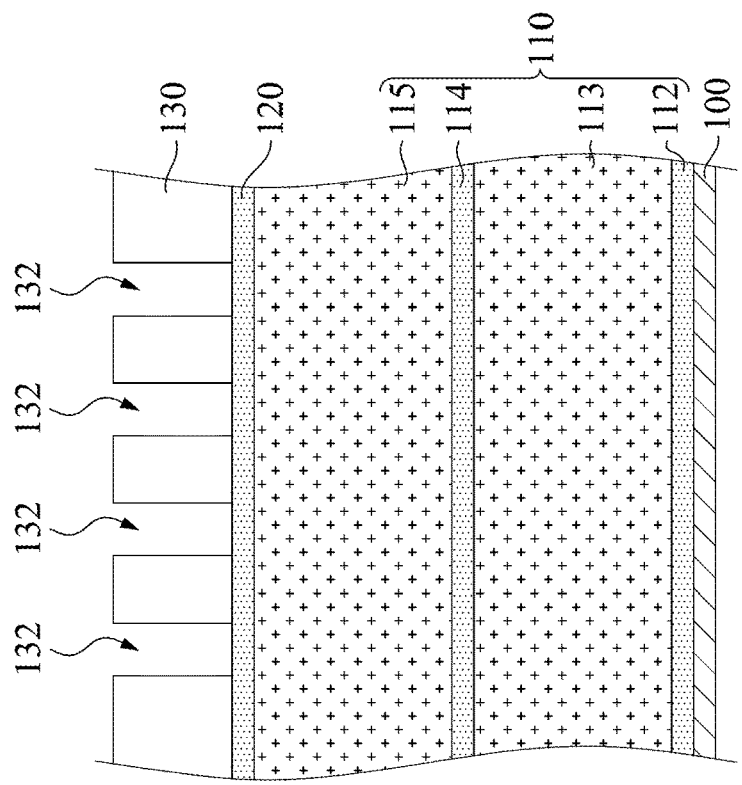
FIG. 2A and FIG. 2B are respectively a top view and a cross-sectional view of a semiconductor structure at one stage in accordance with one embodiment of the present disclosure.
Figure 2A:
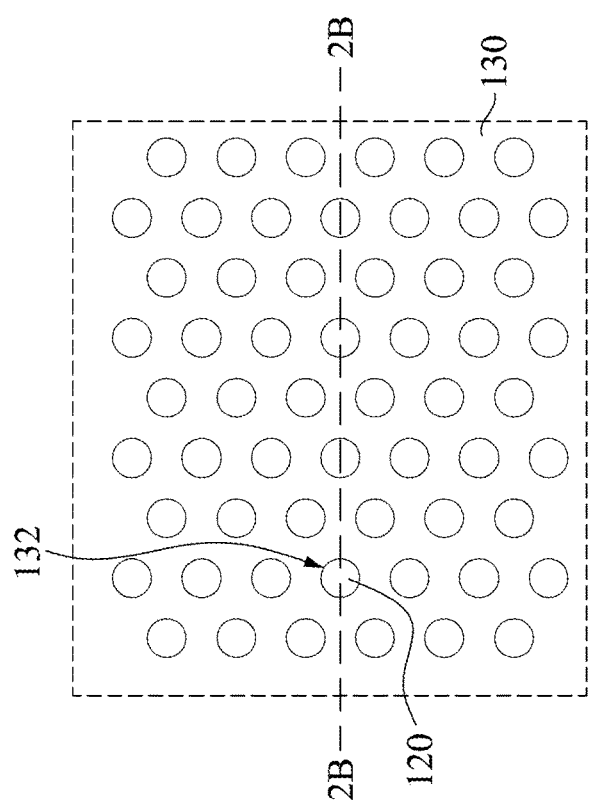

FIG. 2A and FIG. 2B are respectively a top view and a cross-sectional view of a semiconductor structure at one stage in accordance with one embodiment of the present disclosure. FIG. 2B is taken along line 2B-2B of FIG. 2A. Referring to FIG. 2A and FIG. 2B, a first mask layer 130 is formed on the dielectric stack 110. The first mask layer 130 has a plurality of first through holes 132, and a portion of the first through holes 132 are located in a central portion of the first mask layer 130. In other words, the first mask layer 130 is in contact with the first isolation layer 120. The first through holes 132 expose the underlying first isolation layer 120.

In some embodiments, the first mask layer 130 is made of a photoresist material or multilayer dielectrics. For example, the first mask layer 130 is made of a black photoresist material or multilayer dielectrics, such as oxide-nitride-oxide (ONO). In some embodiments, the method of forming the first mask layer 130 may include first forming a photoresist layer on the first isolation layer 120 and then patterning the photoresist layer with a photolithography process.

Figure 3B:
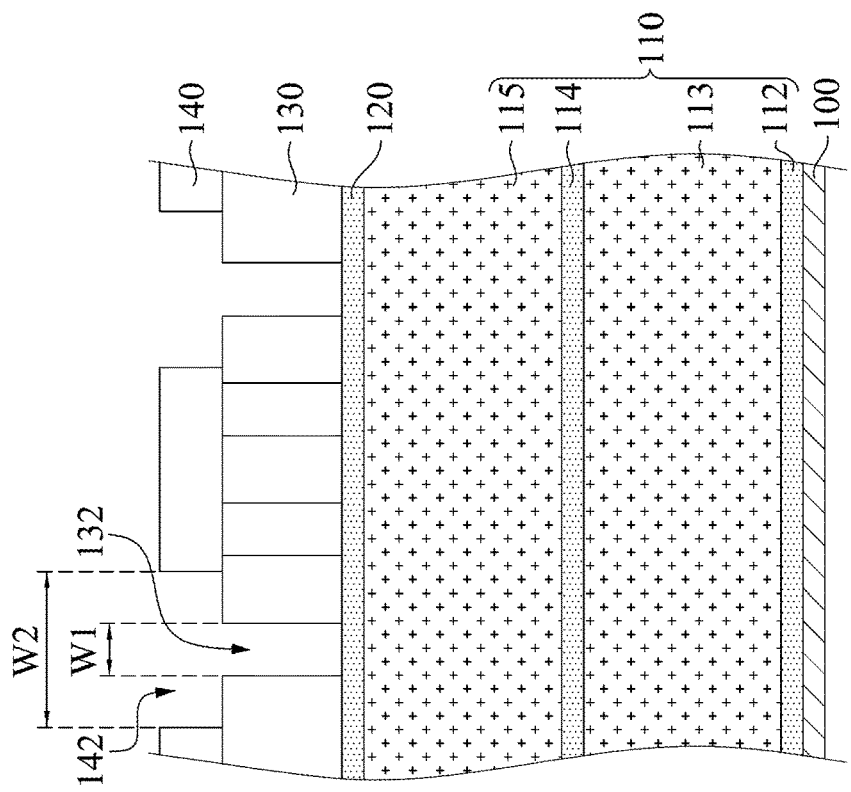
FIG. 3A and FIG. 3B are respectively a top view and a cross-sectional view of a semiconductor structure at one stage in accordance with one embodiment of the present disclosure.
Figure 3A:
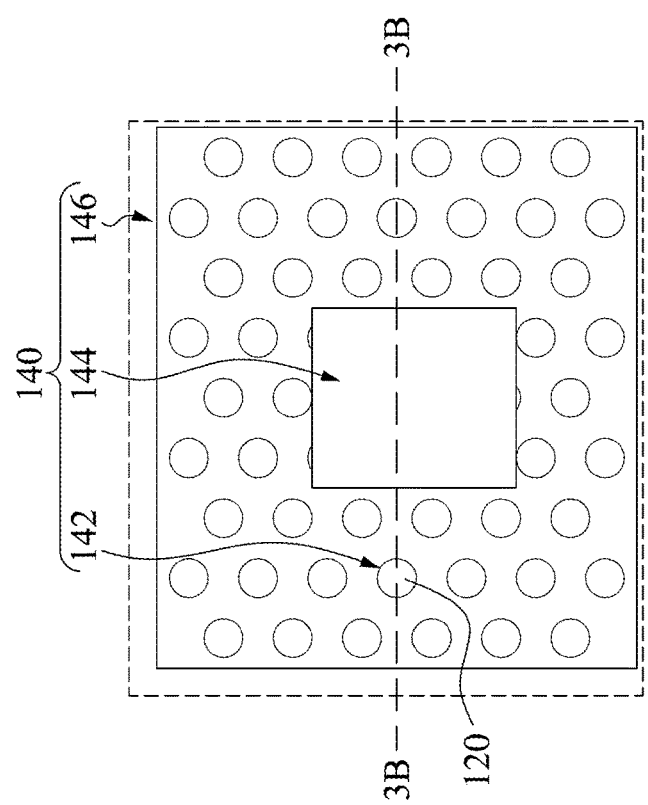

FIG. 3A and FIG. 3B are respectively a top view and a cross-sectional view of a semiconductor structure at one stage in accordance with one embodiment of the present disclosure. FIG. 3B is taken along line 3B-3B of FIG. 3A. Referring to FIG. 2A, FIG. 2B, FIG. 3A and FIG. 3B, after the first mask layer 130 is formed on the dielectric stack 110, a second mask layer 140 is formed on the first mask layer 130 and in the first through holes 132. In other words, the second mask layer 140 covers the first mask layer 130 and filled in the first through holes 132.

After the second mask layer 140 is formed on the first mask layer 130 and in the first through holes 132, the second mask layer 140 is patterned to form a first opening 142 between a central portion 144 and a peripheral portion 146 of the second mask layer 140, such that the second mask layer 140 in the first through holes 132 below the first opening 142 is removed. As a result, a structure of the first mask layer 130 and the second mask layer 140 is beneficial to improve smaller size of a capacitor in following processes. By adjusting the size of the capacitor, the desired design of the semiconductor structure can be achieved.

In greater details, the central portion 144 of the second mask layer 140 covers the portion of the first through holes 132 in the central portion of the first mask layer 130 and is surrounded by the peripheral portion 146. The central portion 144 of the second mask layer 140 is located correspondingly on the central portion of the first mask layer 130. For example, the central portion 144 of the second mask layer 140 is at same vertical level as the central portion of the first mask layer 130.

In some embodiments, patterning the second mask layer 140 is such that the first opening 142 of the second mask layer 140 directly connects the first through hole 132 of the first mask layer 130. The first through holes 132 exposes the underlying first isolation layer 120. In some embodiments, patterning the second mask layer 140 is such that a width W2 of the first opening 142 of the second mask layer 140 is larger than a width W1 of the first through hole 132 of the first mask layer 130.

In some embodiments, as shown in FIG. 3B, the second mask layer 140 and the first mask layer 130 have a stepped profile. As shown in FIG. 3A, the second mask layer 140 has a hollow-shaped or donut-shaped pattern. In some other embodiments, the second mask layer 140 has a mesh-shaped pattern.

In some embodiments, the central portion 144 and the peripheral portion 146 of the second mask layer 140 are light shielding portions. In some embodiments, the central portion 144 and the peripheral portion 146 of the second mask layer 140 are made of photoresist materials or multilayer dielectrics. For example, the central portion 144 and the peripheral portion 146 of the second mask layer 140 are made of black photoresist materials or multilayer dielectrics, such as oxide-nitride-oxide (ONO).

Figure 4B:
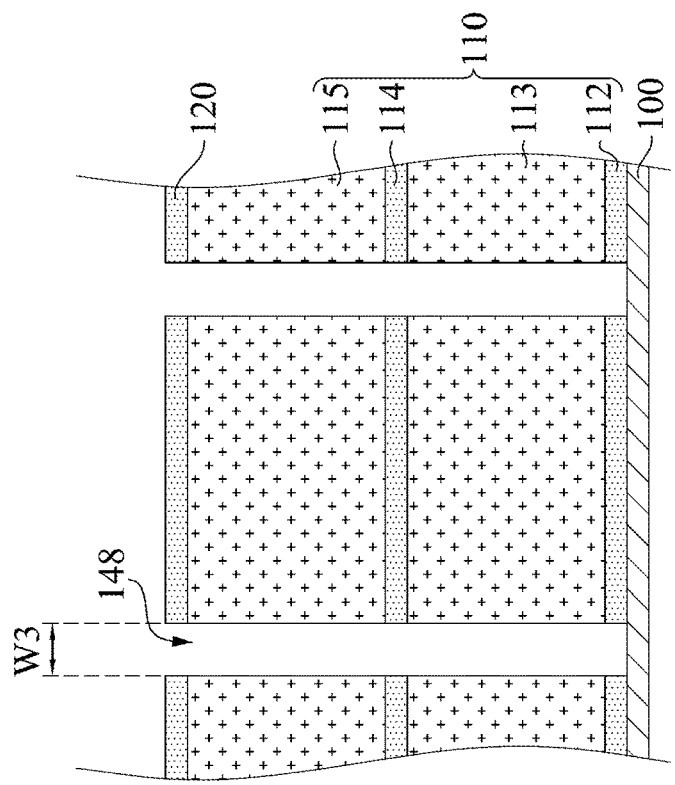
FIG. 4A and FIG. 4B are respectively a top view and a cross-sectional view of a semiconductor structure at one stage in accordance with one embodiment of the present disclosure.
Figure 4A:
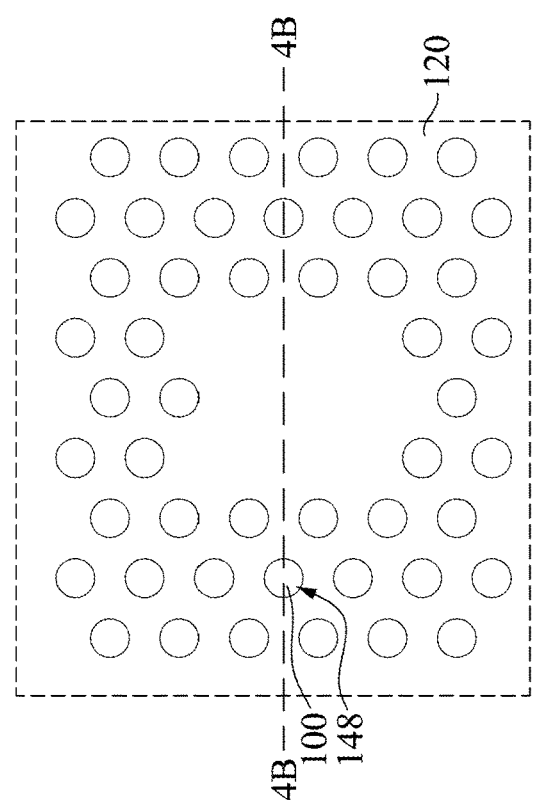

FIG. 4A and FIG. 4B are respectively a top view and a cross-sectional view of a semiconductor structure at one stage in accordance with one embodiment of the present disclosure. FIG. 4B is taken along line 4B-4B of FIG. 4A. Referring to FIG. 3A, FIG. 3B, FIG. 4A and FIG. 4B, after the second mask layer 140 is patterned, the dielectric stack 110 is etched below the first through holes 132 to form a second through hole 148. In greater details, the first isolation layer 120 and the dielectric stack 110 are etched using the first mask layer 130 and the second mask layer 140 as etch masks. The etching process deepens the first through hole 132 until reaching the bottom metal 100 so as to form the second through hole 148. The bottom metal 100 is exposed through the second through hole 148.

In some embodiments, after the first isolation layer 120 and the dielectric stack 110 are etched, the first mask layer 130 and the second mask layer 140 are removed.

In some embodiments, as shown in FIG. 3B and FIG. 4B, a depth of the second through hole 148 is larger than the first through hole 132. In some embodiments, as shown in FIG. 3B and FIG. 4B, a width W3 of the second through hole 148 is substantially same as the width W1 of the first through hole 132.

Figure 5B:
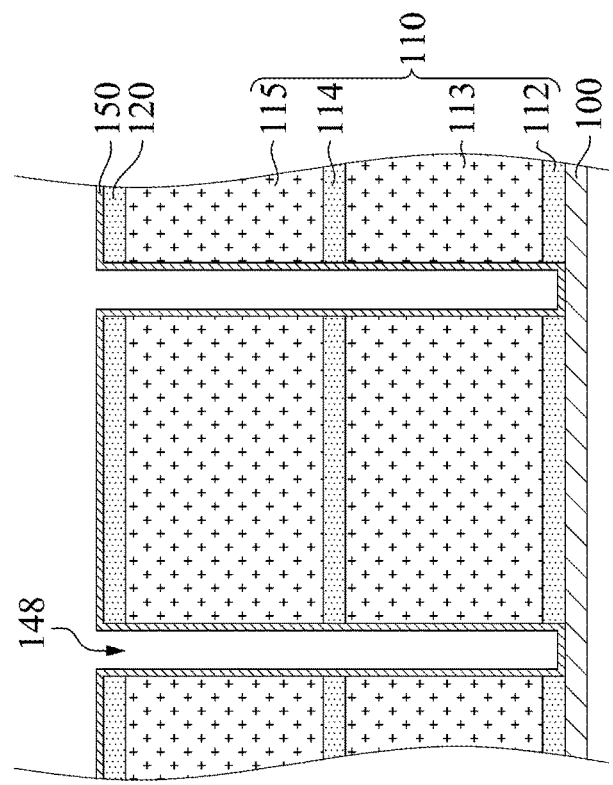
FIG. 5A and FIG. 5B are respectively a top view and a cross-sectional view of a semiconductor structure at one stage in accordance with one embodiment of the present disclosure.
Figure 5A:
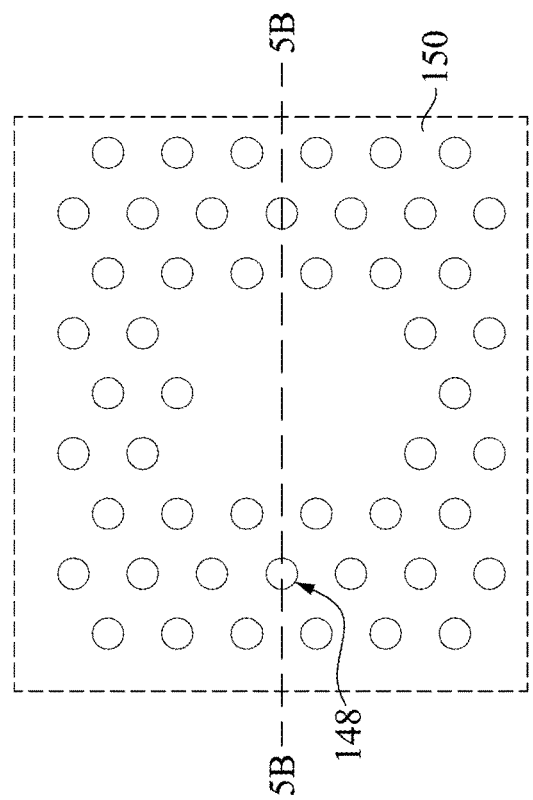

FIG. 5A and FIG. 5B are respectively a top view and a cross-sectional view of a semiconductor structure at one stage in accordance with one embodiment of the present disclosure. FIG. 5B is taken along line 5B-5B of FIG. 5A. Referring to FIG. 5A and FIG. 5B, after the second through hole 148 is formed, a metal layer 150 is formed on a sidewall and a bottom surface of the second through hole 148 and a top surface of the dielectric stack 110. In other words, the metal layer 150 covers the bottom metal 100 and the first isolation layer 120. In some embodiments, the metal layer 150 is in contact with the bottom metal 100, the dielectric stack 110, and the first isolation layer 120.

Figure 6B:
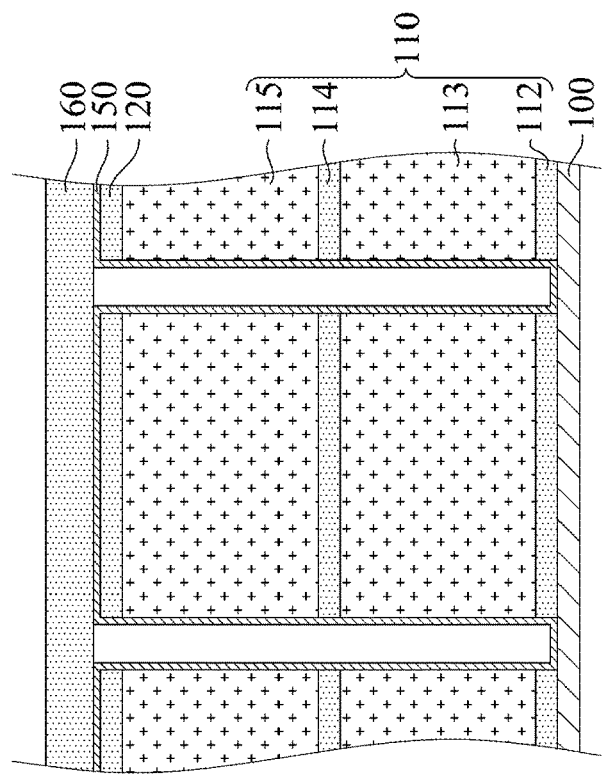
FIG. 6A and FIG. 6B are respectively a top view and a cross-sectional view of a semiconductor structure at one stage in accordance with one embodiment of the present disclosure.
Figure 6A:
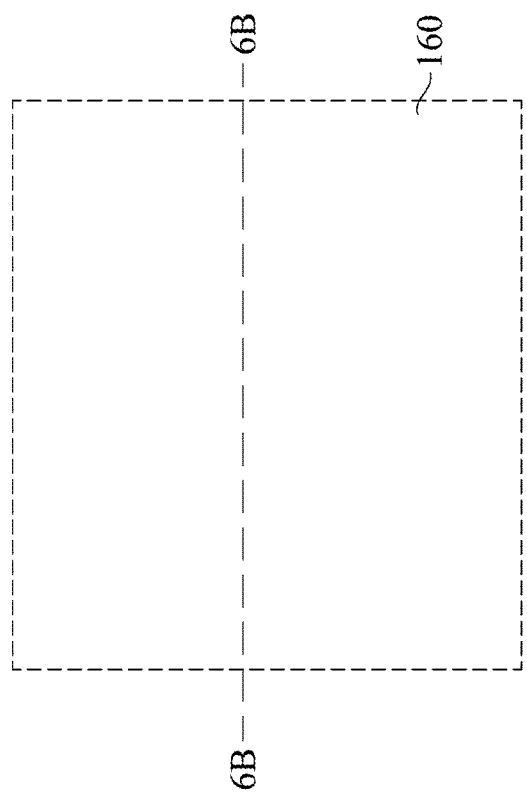

FIG. 6A and FIG. 6B are respectively a top view and a cross-sectional view of a semiconductor structure at one stage in accordance with one embodiment of the present disclosure. FIG. 6B is taken along line 6B-6B of FIG. 6A. Referring to FIG. 6A and FIG. 6B, after the metal layer 150 is formed, a second isolation layer 160 is formed on the first isolation layer 120, such that the metal layer 150 is between the first isolation layer 120 and the second isolation layer 160. In other words, the second isolation layer 160 covers the metal layer 150. The second isolation layer 160 is in contact with the metal layer 150 on the top surface of the dielectric stack 110.

In some embodiments, the second isolation layer 160 may be made of a nitride material. For example, the second isolation layer 160 is made of silicon nitride or other suitable dielectric materials. In some embodiments, the second isolation layer 160 is formed by chemical vapor deposition CVD, ALD, or other suitable process. In some embodiments, the second isolation layer 160 is made of same materials as the first isolation layer 120.

Figure 7B:
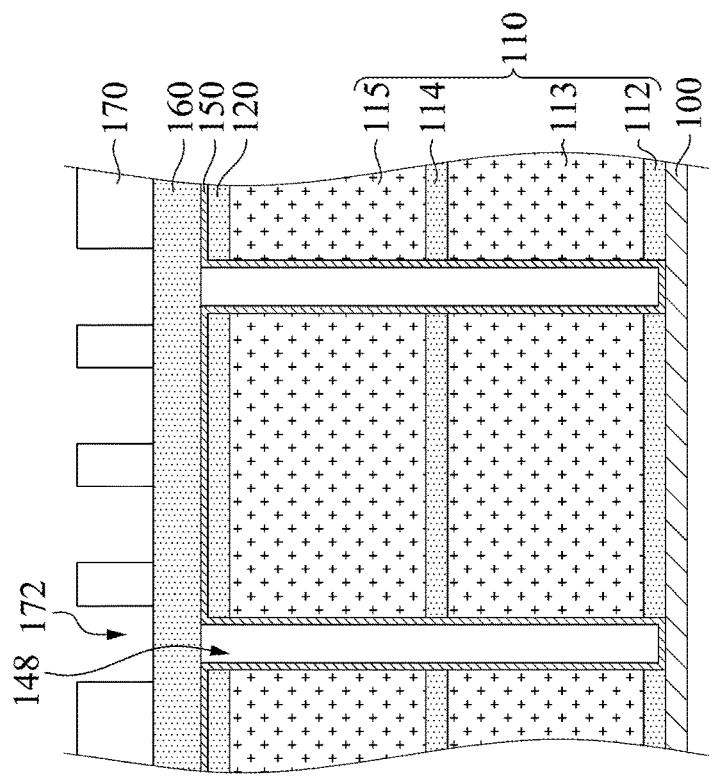
FIG. 7A and FIG. 7B are respectively a top view and a cross-sectional view of a semiconductor structure at one stage in accordance with one embodiment of the present disclosure.
Figure 7A:
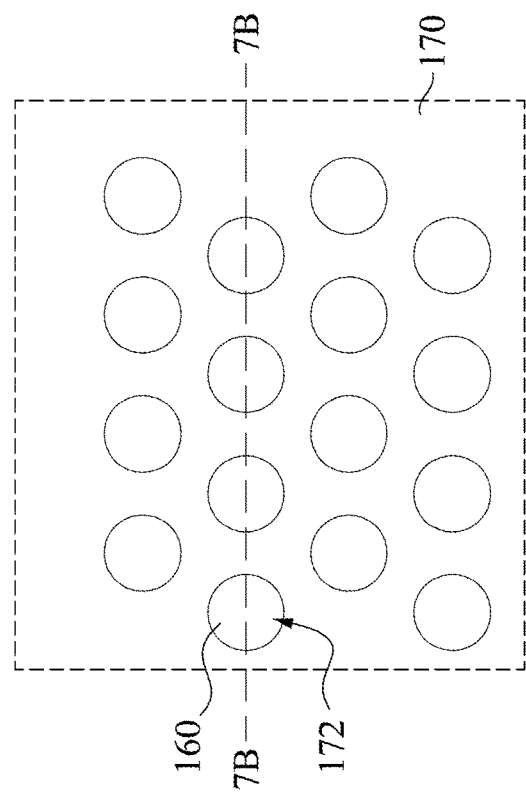

FIG. 7A and FIG. 7B are respectively a top view and a cross-sectional view of a semiconductor structure at one stage in accordance with one embodiment of the present disclosure. FIG. 7B is taken along line 7B-7B of FIG. 7A. Referring to FIG. 7A and FIG. 7B, after the second isolation layer 160 is formed, a third mask layer 170 is formed on the second isolation layer 160. The third mask layer 170 has a second opening 172 which exposes the underlying second isolation layer 160.

In some embodiments, the second opening 172 is aligned with the second through hole 148. The second opening 172 and the second through hole 148 are separated by the second isolation layer 160. In some embodiments, a width of the second opening 172 is larger than the width of the second through hole 148.

In some embodiments, the third mask layer 170 has a lattice-shaped pattern. In some embodiments, the third mask layer 170 is made of a photoresist material or multilayer dielectrics. For example, the third mask layer 170 is made of a black photoresist material or multilayer dielectrics, such as oxide-nitride-oxide (ONO). In some embodiments, the method of forming the third mask layer 170 may include first forming a photoresist layer and then patterning the photoresist layer with a photolithography process.

Figure 8B:
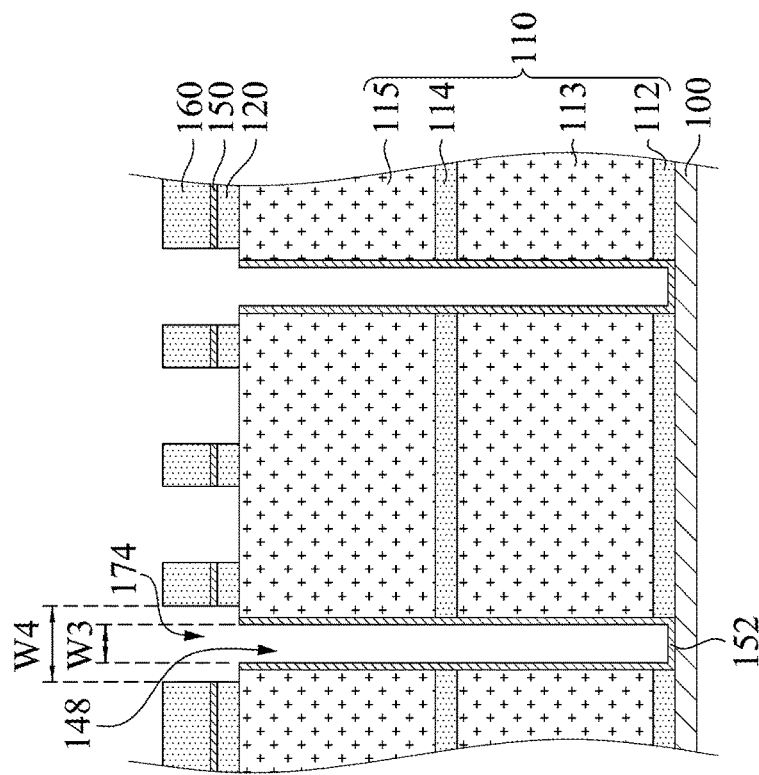
FIG. 8A and FIG. 8B are respectively a top view and a cross-sectional view of a semiconductor structure at one stage in accordance with one embodiment of the present disclosure.
Figure 8A:
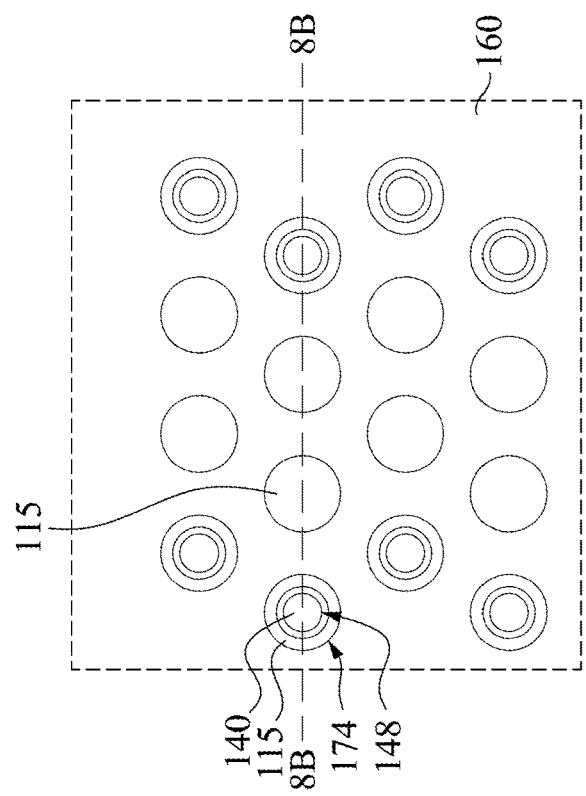

FIG. 8A and FIG. 8B are respectively a top view and a cross-sectional view of a semiconductor structure at one stage in accordance with one embodiment of the present disclosure. FIG. 8B is taken along line 8B-8B of FIG. 8A. Referring to FIG. 8A and FIG. 8B, after the third mask layer 170 is formed, the metal layer 150 on the top surface of the dielectric stack 110 is etched to form a third through hole 174. In greater details, the metal layer 150 and the second isolation layer 160 are etched using the third mask layer 170 as an etch mask. The etching process removes a portion of the metal layer 150 and the second isolation layer 160, such that the third through hole 174 directly connects to the second through hole 148. A bottom portion 152 of the metal layer 150 is exposed through the second through hole 148.

In some embodiments, after the metal layer 150 and the second isolation layer 160 are etched, the third mask layer 170 is removed.

In some embodiments, a width W4 of the third through hole 174 is larger than the width W3 of the second through hole 148. In some embodiments, a depth of the third through hole 174 is smaller than the depth of the second through hole 148.

Figure 9B:
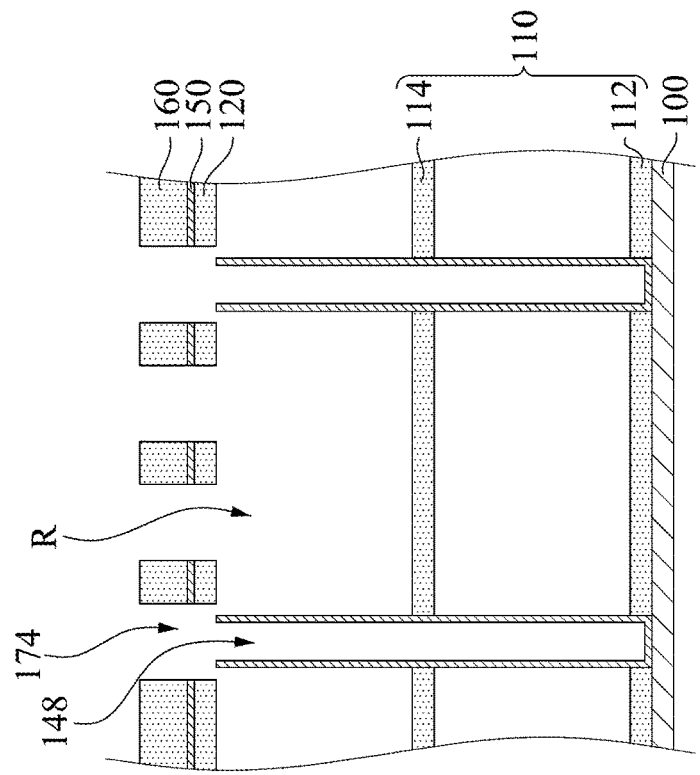
FIG. 9A and FIG. 9B are respectively a top view and a cross-sectional view of a semiconductor structure at one stage in accordance with one embodiment of the present disclosure.
Figure 9A:
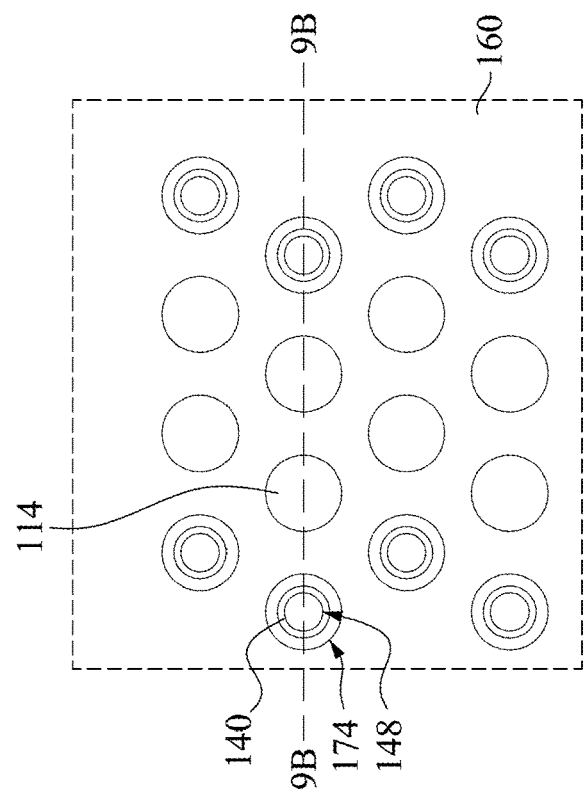

FIG. 9A and FIG. 9B are respectively a top view and a cross-sectional view of a semiconductor structure at one stage in accordance with one embodiment of the present disclosure. FIG. 9B is taken along line 9B-9B of FIG. 9A. Referring to FIG. 8A, FIG. 8B, FIG. 9A and FIG. 9B, after the third through hole 174 is formed, the first oxide layer 135 and the second oxide layer 115 of the dielectric stack 110 are removed to form a recess R. In some embodiments, the recess R directly connects to the third through hole 174. The recess R and the second through hole 148 are separated apart by the metal layer 150.

FIG. 10A and FIG. 10B are respectively a top view and a cross-sectional view of a semiconductor structure at one stage in accordance with one embodiment of the present disclosure. FIG. 10B is taken along line 10B-10B of FIG. 9A. Referring to FIG. 9A, FIG. 9B, FIG. 10A and FIG. 10B, after the first oxide layer 135 and the second oxide layer 115 of the dielectric stack 110 are removed, a dielectric structure 180 is formed in the recess R. In greater details, the dielectric structure 180 further formed on a top surface of the second isolation layer 160. The dielectric structure 180 is in contact with the first nitride layer 112, the second nitride layer 114, the first isolation layer 120, the metal layer 150, and the second isolation layer 160. In some embodiments, the dielectric structure 180 is formed in the second through hole 148. In some embodiments, the dielectric structure 180 includes a high-k dielectric material and titanium nitride (TiN).

After the dielectric structure 180 is formed, a first conductive layer 190 is formed in the second through hole 148 and on the top surface of the dielectric stack 110. The first conductive layer 190 is further formed on a top surface of the dielectric structure 180. In some embodiments, the first conductive layer 190 in the second through hole 148 is surrounded by the dielectric structure 180 in the second through hole 148. The metal layer 150, the dielectric structure 180, and the first conductive layer 190 in the second through hole 148 may serve as a capacitor.

In some embodiments, the first conductive layer 190 may be made of metal. In some embodiments, the first conductive layer 190 and the metal layer 150 are made of same materials.

After the first conductive layer 190 is formed, a top electrode 200 is formed in the third through hole 174. In other words, the top electrode 200 is formed on the first conductive layer 190. Stated differently, the top electrode 200 electrically connects to the first conductive layer 190. In some embodiments, a bottom surface of the top electrode 200 is below to a bottom surface of the metal layer 150. In some embodiments, the top electrode 200 is made of a polysilicon material.

After the top electrode 200 is formed, a second conductive layer 210 is formed on the top electrode 200. In some embodiments, the second conductive layer 210 is in contact with the top electrode 200. In some embodiments, the second conductive layer 210 is made of metal, such as tungsten.

In summary, because the second mask layer is patterned to form the opening between the central portion and the peripheral portion of the second mask layer, smaller array of capacitor (small-size capacitor) can be achieved. As a result, collapsed risk of the semiconductor structure can be avoided and the performance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:
    forming a dielectric stack on a bottom metal;
    forming a first mask layer on the dielectric stack, wherein the first mask layer has a plurality of first through holes, and a portion of the first through holes is in a central portion of the first mask layer;
    forming a second mask layer on the first mask layer and in the first through holes;
    patterning the second mask layer to form an opening between a central portion and a peripheral portion of the second mask layer, such that the second mask layer in the first through holes below the opening is removed, wherein the central portion of the second mask layer covers the portion of the first through holes and is surrounded by the peripheral portion;
    etching the dielectric stack below the first through holes to form a second through hole, wherein the bottom metal is exposed through the second through hole; and
    forming a conductive layer in the second through hole and on a top surface of the dielectric stack.

2. The method of forming the semiconductor structure of claim 1, further comprising:
    forming a metal layer on a sidewall of the second through hole and the top surface of the dielectric stack before forming the conductive layer.

3. The method of forming the semiconductor structure of claim 2, further comprising:
    forming the metal layer on a bottom surface of the second through hole, such that the metal layer is in contact with the bottom metal.

4. The method of forming the semiconductor structure of claim 2, further comprising:
    etching the metal layer on the top surface of the dielectric stack to form a third through hole.

5. The method of forming the semiconductor structure of claim 4, wherein etching a portion of the metal layer is such that the third through hole directly connects to the second through hole.

6. The method of forming the semiconductor structure of claim 4, further comprising:
    forming a top electrode in the third through hole.

7. The method of forming the semiconductor structure of claim 6, wherein forming the top electrode in the third through hole is such that the top electrode electrically connects the conductive layer.

8. The method of forming the semiconductor structure of claim 2, further comprising:
    forming a first isolation layer on the dielectric stack before forming the first mask layer.

9. The method of forming the semiconductor structure of claim 8, further comprising:
    forming a second isolation layer on the first isolation layer, such that the metal layer is between the first isolation layer and the second isolation layer.

10. The method of forming the semiconductor structure of claim 1, further comprising:
    removing an oxide layer of the dielectric stack before forming the conductive layer.

11. The method of forming the semiconductor structure of claim 1, further comprising:
    forming a dielectric structure in the second through hole before forming the conductive layer, such that the conductive layer in the second through hole is surrounded by the dielectric structure.

12. The method of forming the semiconductor structure of claim 1, wherein the peripheral portion and the central portion of the second mask layer are made of photoresist materials.

13. The method of forming the semiconductor structure of claim 1, wherein patterning the second mask layer is such that the opening of the second mask layer directly connects the first through hole of the first mask layer.

14. The method of forming the semiconductor structure of claim 1, wherein patterning the second mask layer is such that a width of the opening of the second mask layer is larger than a width of the first through hole of the first mask layer.

* * * * *